United States Patent
Chung

(10) Patent No.: US 9,306,534 B2
(45) Date of Patent: Apr. 5, 2016

(54) IMPEDANCE MATCHING APPARATUS AND IMPEDANCE MATCHING METHOD

(75) Inventor: Won Suk Chung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 17 days.

(21) Appl. No.: 14/235,661

(22) PCT Filed: Jul. 20, 2012

(86) PCT No.: PCT/KR2012/005805
§ 371 (c)(1),
(2), (4) Date: Jan. 28, 2014

(87) PCT Pub. No.: WO2013/015572
PCT Pub. Date: Jan. 31, 2013

(65) Prior Publication Data
US 2014/0170996 A1    Jun. 19, 2014

(30) Foreign Application Priority Data
Jul. 28, 2011   (KR) .................. 10-2011-0075472

(51) Int. Cl.
*H04B 1/04* (2006.01)
*H03H 7/40* (2006.01)
(Continued)

(52) U.S. Cl.
CPC .............. *H03H 7/40* (2013.01); *H04B 1/0458* (2013.01); *H04B 1/0475* (2013.01); *H04B 17/103* (2015.01); *H03H 2007/386* (2013.01); *H04B 1/0057* (2013.01); *H04B 1/406* (2013.01)

(58) Field of Classification Search
CPC .... H04B 1/0458; H04B 1/0483; H04B 1/406; H04B 1/005; H04B 1/0057; H04B 1/006; H03H 7/40; H03H 2007/386; H03H 7/38

USPC ......... 455/120, 121, 123, 124, 125, 275, 289, 455/290, 126, 127.3, 127.4
See application file for complete search history.

(56) References Cited

U.S. PATENT DOCUMENTS 3,601,717 A * 8/1971 Kuecken ...................... 333/17.1
5,973,568 A * 10/1999 Shapiro et al. ................ 330/295
(Continued)

FOREIGN PATENT DOCUMENTS

JP    2007-166534 A    6/2007
KR    10-2004-0076682 A    9/2004
(Continued)

OTHER PUBLICATIONS

International Search Report in International Application No. PCT/KR2012/005805 filed Jul. 20, 2012.

*Primary Examiner* — Duc M Nguyen
(74) *Attorney, Agent, or Firm* — Saliwanchik, Lloyd & Eisenschenk

(57) ABSTRACT

Disclosed are an impedance matching apparatus and an impedance matching method thereof. The impedance matching apparatus performs impedance matching between a front end module and an antenna. The impedance matching apparatus includes a switching unit to selectively select multiple-band RF input signals, a power amplifying unit to amplify the RF input signal selected from the switching unit, a reflected power measuring unit to measure a reflection coefficient for the RF input signal, a matching unit to adjust a variable device so that the reflection coefficient is minimized, and a controller to provide a variable device value allowing the minimum reflection coefficient based on the amplified RF input signal and the reflection coefficient.

16 Claims, 2 Drawing Sheets

(51) Int. Cl.
  *H04B 17/10* (2015.01)
  *H04B 1/403* (2015.01)
  *H04B 1/00* (2006.01)
  *H03H 7/38* (2006.01)

(56) References Cited

U.S. PATENT DOCUMENTS

| | | | |
|---|---|---|---|
| 6,397,077 B1* | 5/2002 | Jensen | 455/553.1 |
| 6,496,708 B1* | 12/2002 | Chan | H03H 7/461 330/126 |
| 6,961,368 B2* | 11/2005 | Dent et al. | 375/219 |
| 7,110,727 B2* | 9/2006 | Dekker | H04B 1/0483 455/115.1 |
| 2002/0101907 A1* | 8/2002 | Dent et al. | 375/132 |
| 2007/0197180 A1* | 8/2007 | McKinzie et al. | 455/248.1 |
| 2008/0026710 A1* | 1/2008 | Buckley | 455/127.5 |
| 2008/0212552 A1* | 9/2008 | Fukamachi et al. | 370/343 |
| 2010/0073103 A1* | 3/2010 | Spears et al. | 333/17.3 |
| 2010/0105425 A1* | 4/2010 | Asokan | 455/552.1 |
| 2010/0309901 A1* | 12/2010 | Beghini et al. | 370/343 |
| 2011/0043298 A1* | 2/2011 | McKinzie, III | 333/17.3 |
| 2012/0243579 A1* | 9/2012 | Premakanthan et al. | 375/219 |
| 2015/0312018 A1* | 10/2015 | Li | H04L 5/1415 370/278 |

FOREIGN PATENT DOCUMENTS

| | | |
|---|---|---|
| KR | 10-2007-0093684 A | 9/2007 |
| KR | 10-2006-0078286 A | 8/2008 |

* cited by examiner

IMPEDANCE MATCHING APPARATUS AND IMPEDANCE MATCHING METHOD

CROSS-REFERENCE TO RELATED APPLICATIONS

This application is the U.S. national stage application of International Patent Application No. PCT/KR2012/005805, filed Jul. 20, 2012, which claims priority to Korean Application No. 10-2011-0075472, filed Jul. 28, 2011, the disclosures of each of which are incorporated herein by reference in their entirety.

TECHNICAL FIELD

The disclosure relates to an impedance matching apparatus. In more particular, the disclosure relates to an impedance matching apparatus capable of improving impedance matching efficiency and an impedance matching method thereof.

BACKGROUND ART

An antenna circuit of a mobile communication terminal allows an antenna to transmit or receive predetermined radio signals. In order to optimize the transmit/receive radiation performance of the antenna, impedance matching must be exactly performed in the optimal state.

Therefore, the antenna circuit includes capacitors and inductors, and adjusts values of the capacitors and the inductors, thereby exactly performing impedance matching. In general, the impedance matching of the antenna is achieved in a state that the mobile communication terminal is positioned in a free space.

Meanwhile, the mobile communication terminal may be used by a user in a state that the user handholds the body thereof and adheres a speaker to the ear of the user due to the characteristic of the mobile communication terminal, or may be used by the user through an ear-phone in a state that the body of the mobile communication terminal is put into a pocket or a bag of the user. As the user uses the mobile communication terminal by gripping the mobile communication terminal with the hand of the user and closely touching the speaker thereof to the ear of the user, or as the user uses the mobile communication terminal put into the pocket or the bag, the conditions for the impedance matching of the antenna vary, so that the transmit/receive radiation performance of the antenna subject to impedance matching in the free space may be degraded.

Therefore, the mobile communication terminal employs an impedance matching apparatus having an antenna circuit to automatically adjust the impedance of the antenna when the conditions for the impedance matching of the antenna vary, so that the antenna has the optimal transmit/receive radiation performance.

To this end, the impedance matching apparatus includes a coupler to detect reflected power and forward power subject to coupling in the coupler, and to change the capacitance of a variable capacitor according to the reflected power and the forward power, so that impedance matching can be performed.

However, according to the impedance matching apparatus of the related art, the transmit power is measured by an external detection unit, so that the accuracy in the measurement of the transmit power may be degraded.

DISCLOSURE OF INVENTION

Technical Problem

An object of the disclosure is to provide an impedance matching apparatus capable of improving the measurement efficiency of forward power by directly detecting the forward power of an RF input signal in the impedance matching apparatus, and an impedance matching method thereof.

Another object of the disclosure is to provide an impedance matching apparatus capable of reducing the cost caused by a detector by omitting an additional detector to detect forward power, and an impedance matching method thereof.

Still another object of the disclosure is to provide an impedance matching apparatus capable of effectively performing impedance matching by using an impedance matching circuit and an impedance matching method thereof.

Solution to Problem

According to the disclosure, there is provided an impedance matching apparatus to perform impedance matching between a front end module and an antenna. The impedance matching apparatus includes a switching unit to selectively select multiple-band RF input signals, a power amplifying unit to amplify the RF input signal selected from the switching unit, a reflected power measuring unit to measure a reflection coefficient for the RF input signal, a matching unit to adjust a variable device so that the reflection coefficient is minimized, and a controller to provide a variable device value allowing the minimum reflection coefficient based on the amplified RF input signal and the reflection coefficient.

According to another embodiment of the disclosure, there is provided an impedance matching method of an impedance matching apparatus including switching multiple-band RF input signals, amplifying the switched RF input signal, detecting the amplified RF input signal, providing the detected RF input signal, and measuring a reflection coefficient for the RF input signal and performing impedance matching so that the reflection coefficient is minimized.

Advantageous Effects of Invention

As described above, according to the embodiment of the disclosure, the measurement efficiency of forward power can be improved by directly detecting an RF input signal generated from the RF front end.

In addition, according to the embodiment of the disclosure, the cost can be reduced by omitting an additional detector to detect the forward power.

Further, according to the embodiment of the disclosure, an impedance matching apparatus capable of effectively performing impedance matching by using an impedance matching circuit and an impedance matching method thereof can be provided.

BEST MODE FOR CARRYING OUT THE INVENTION

Hereinafter, the embodiment of the disclosure will be described with reference to accompanying drawings.

Figure 1:
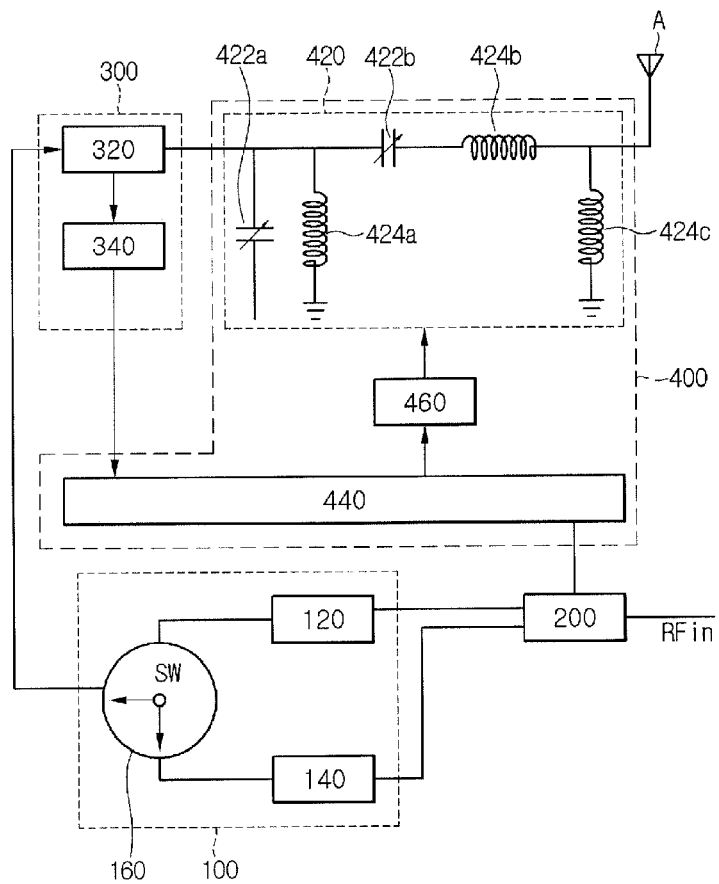
FIG. 1 is a block diagram showing an impedance matching apparatus according to the disclosure.
Figure 2:
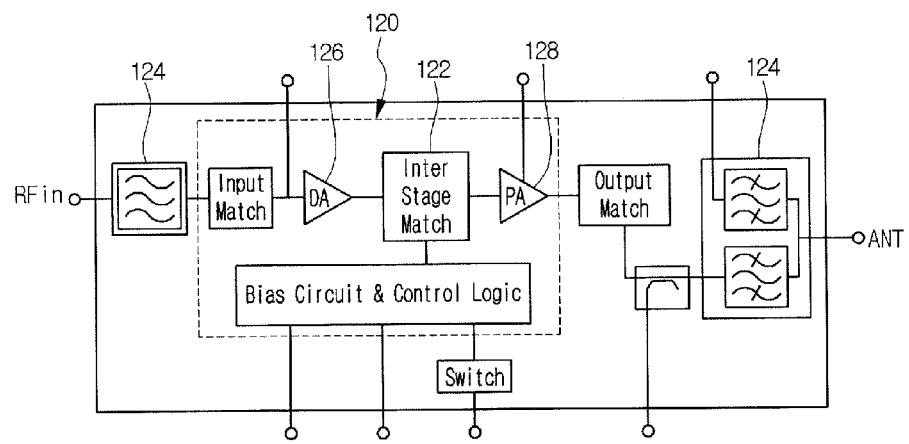
FIG. 2 is a block diagram showing a CDMA power amplifier provided in the impedance matching apparatus according to the disclosure.
Figure 3:
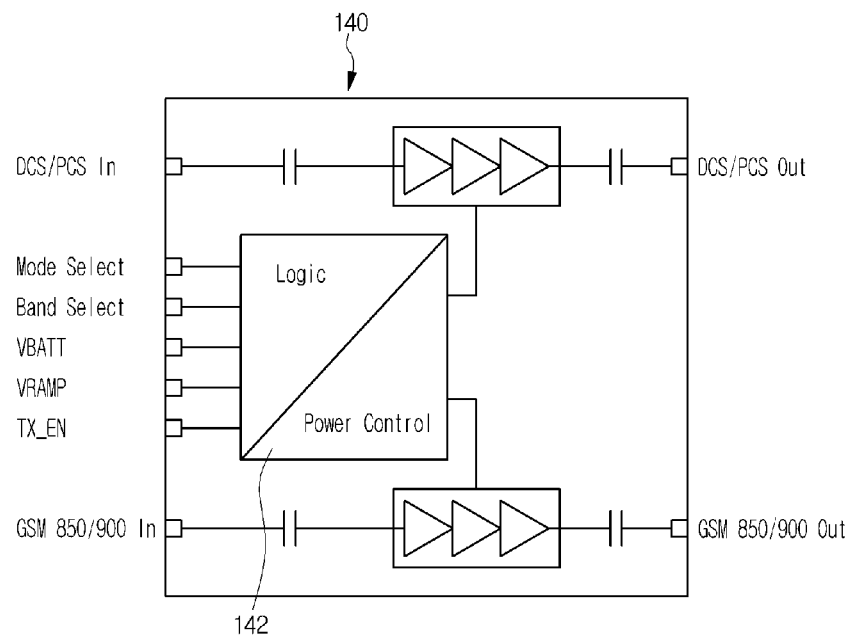
FIG. 3 is a block diagram showing a GSM power amplifier provided in the impedance matching apparatus according to the disclosure.

FIG. 1 is a block diagram showing an impedance matching apparatus according to the disclosure, FIG. 2 is a block diagram showing a CDMA power amplifier provided in the impedance matching apparatus according to the disclosure, and FIG. 3 is a block diagram showing a GSM power amplifier provided in the impedance matching apparatus according to the disclosure.

Referring to FIGS. 1 to 3, an impedance matching apparatus according to the disclosure includes a switching unit 100 to selectively switch a multiple-band RF input signal, a power amplifying unit including a first power amplifier 120 to process a first RF input signal selected by the switching unit 100 and a second power amplifier 140 to process a second RF input signal, a reflected power measuring unit 300 to measure a reflection coefficient for the RF input signal, a matching unit 400 to minimize the reflection coefficient by adjusting a variable device, and a controller 440 to measure the amplified RF input signal and the reflection coefficient and provide a variable device value to minimize the reflection coefficient.

The switching unit 100 selectively switches the RF input signal, for example, the multiple-band RF input signal. The multiple-band RF input signal may include a wideband code division multiple access (W-CDMA) signal and a global system for mobile (GSM) signal.

Accordingly, the switching unit 100 may provide one of the CDMA signal and the GSM signal among multiple-band signals as an input signal by selectively switching the CDMA signal or the GSM signal.

The switching unit 100 may include an RF switch. In particular, an RF MEMS switch having significantly less insertion loss may be used. The RF MEMS switch can minimize the parasitic component generated from the switch.

The switching unit 100 may include the power amplifying unit to amplify multiple-band RF input signals.

The power amplifying unit may include the first power amplifier 120 to amplify the CDMA signal and the second power amplifier 140 to amplify the GSM signal.

The first power amplifier 120 amplifies the CDMA signal if the CDMA signal is input as the RF input signal. The second power amplifier 140 amplifies the GSM signal if the GSM signal is input as the RF input signal.

As shown in FIG. 2, the first power amplifier 120 may include a coupler 122 to detect an input signal, and may further include a driving amplifier (DA) 126 between an RF front end and the coupler 122 to generate driving power by using the CDMA input signal.

In addition, the coupler 122 may include a power amplifier (PA) 128 for amplifying the CDMA input signal satisfying the output condition to an output signal.

In the RF front end a filter 124 for removing noise from the CDMA input signal may be provided, and a filter 124 for removing noise from the CDMA input signal amplified by the power amplifier 128 may be further provided.

Accordingly, the CDMA input signal can stably be output through the first power amplifier 120 without the loss of the input signal.

As shown in FIG. 3, the second power amplifier 140 includes a fixed power amplifier 142 to amplify a GSM signal to fixed power. Accordingly, the input GSM input signal may be fixedly amplified to a constant value.

Accordingly, the switching unit 100 can select a required RF input signal from the multiple-band RF input signals, and the selected RF input signal is power-amplified according to the types thereof, for example, the CDMA signal or the GSM signal, so that the selected RF input signal may be used as an output signal.

In addition, the switching unit 100 may provide the RF input signal to an antenna A so that the reflection coefficient can be measured by the reflected power measuring unit 300.

An RF power measuring module 200 may be connected to the first and second power amplifiers 120 and 140. The RF power measuring module 200 may detect a multiple-band RF input signal selected from RF input signals. In this case, the RF power measuring module 200 may include a transceiver.

The RF power measuring module 200 may detect the forward power of the RF input signal. The forward power of the RF input signal may include power transmitted to the antenna A. The RF power may include power transmitted to the antenna A.

The reflected power measuring unit 300 is connected to the antenna A to measure reflected power according to the RF input signal from the antenna A, for example, a reflection coefficient. The reflected power measuring unit 300 may include a directional coupler.

The reflected power measuring unit 300 may include a detector 320 to detect a reflection coefficient. In more detail, the reflected power measuring unit 300 may include one detector 320.

Different from the related art requiring two detectors to measure both of the RF input single and the reflection coefficient, the disclosure provides only one detector to more reduce cost as compared with the cost of the related art.

The reflected power measuring unit 300 may be additionally connected to an AD converter (not shown). The AD converter (not shown) converts an analog signal measured from the reflected power measuring unit 300 into a digital signal.

The matching unit 420 controls capacitors to minimize the reflection coefficient. Accordingly, the matching unit 420 may easily perform impedance matching between the RF input signal and the RF output signal by performing a control operation so that the reflection coefficient has the minimum value.

To this end, the matching unit 420 may include a plurality of variable capacitors 422a and 422b and fixed inductors 424a, 424b, and 424c which act as variable devices. The variable capacitors 422a and 422b may include first and second variable capacitors 422a and 422b. The first variable capacitor 422a may be parallel-connected to the RF rear end, and the second variable capacitor 422b may be series-connected to the RF rear end.

The fixed inductors 424a, 424b, and 424c may include first to third inductors 424a to 424c. The first inductor 424a may be series-connected to the RF rear end, and the second inductor 424b may be parallel-connected to the third inductor 424c.

The connections between the variable capacitors 422a and 422b and the fixed inductors 424a, 424b, and 424c and the number of devices may be varied in various structures according to the embodiments.

The matching unit 420 can receive a signal under the control signal of the controller 440, and a DA converter 460 may be further provided between the matching unit 420 and the controller 440.

In more detail, the controller 440 may apply signals to the variable capacitors 422a and 422b to find the optimal tuned values by adjusting the capacitances of the variable capacitors 422a and 422b.

Figure 4:
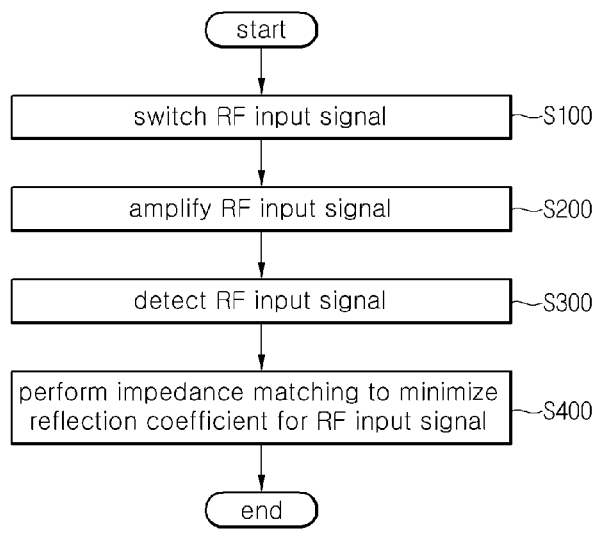
FIG. 4 is a flowchart showing an impedance matching method according to the disclosure.

Hereinafter, an impedance matching method according to the disclosure will be described with reference to FIG. 4.

A step of switching multiple-band RF input signals in the RF front end may be performed (step S100). In this case, one of the CDMA signal and the GSM signal may be input to the RF front end according to the transceive schemes.

If one RF input signal of the CDMA signal and the GSM signal is provided, the RF input signal may be amplified (step S200).

The CDMA signal may be amplified by the first power amplifier 120. In more detail, as the CDMA signal is input to the first power amplifier 120, the RF input signal is amplified to a driving signal and then the driving signal is amplified to an output signal corresponding to an output condition.

In contrast, the GSM signal may be amplified by the second power amplifier, and may be amplified to a predetermined value by the fixed power amplifier.

If the RF input signal is amplified by the power amplifying unit as described above, the RF input signal is detected (step S300). The amplified RF input signal may be detected from the RF power measuring module.

In this case, the RF power measuring module may selectively detect the CDMA signal or the GSM signal according to the RF input signal.

If the RF input signal is detected as described above, the detected RF input signal is provided.

The RF input signal may be applied to the controller. Accordingly, the controller can receive the RF signal without signal loss differently from the related art in which the RF input signal is received by an external detector.

If the RF input signal is received as described above, the controller may perform an impedance matching step (step S400).

In other words, the controller may measure the reflection coefficient for the RF input signal together with the RF input signal, and may determine the values of variable capacitors to obtain the minimum of the reflection coefficient so that the impedance matching between the RF input signal and the RF output signal is performed.

In this case, various schemes to determine the values of variable capacitors may be performed.

As described above, the RF input signal can be effectively received without signal loss by directly detecting an RF input signal generated from the RF front end according to the disclosure.

Although the exemplary embodiments of the disclosure have been described, it is understood that the disclosure should not be limited to these exemplary embodiments but various changes and modifications can be made by one ordinary skilled in the art within the spirit and scope of the disclosure as hereinafter claimed.

The invention claimed is:

1. An impedance matching apparatus to perform impedance matching between a front end module and an antenna, the impedance matching apparatus comprising:
a power amplifying unit to amplify multiple-band RF input signals,
wherein the power amplifying unit comprises:
a first power amplifier to process a first RF input signal of multiple-band RF input signals; and
a second power amplifier to process a second RF input signal of multiple-band RF input signals,
wherein the first power amplifier comprises a coupler to detect the first RF input signal;
a switching unit to selectively select one of amplified multiple-band RF input signals;
a reflected power measuring unit to measure a reflection coefficient for the selected RF input signal,
wherein the reflected power measuring unit comprises a detector to detect the reflection coefficient from a reflected signal reflected from the antenna;
a matching unit to adjust a variable device so that the reflection coefficient is minimized; and
a controller to provide a variable device value to minimize the reflection coefficient based on the detected first RF input signal and the reflection coefficient.

2. The impedance matching apparatus of claim 1, wherein the first power amplifier further comprises:
a driving amplifier to generate a driving power of the first RF input signal;
and
a power amplifier to amplify the first RF input signal to an output signal satisfying an output condition.

3. The impedance matching apparatus of claim 1, further comprising a filter to remove noise from the RF input signal.

4. The impedance matching apparatus of claim 1, wherein the first RF input signal is a CDMA signal.

5. The impedance matching apparatus of claim 1, wherein the second power amplifier includes a fixed power amplifier to amplify the second RF input signal so that the second RF input signal is selectively output.

6. The impedance matching apparatus of claim 5, wherein the second power amplifier selectively outputs a GSM signal and a PCS signal.

7. The impedance matching apparatus of claim 1, wherein the switching unit includes an RF MEMS switch.

8. The impedance matching apparatus of claim 1, wherein the reflected power measuring unit includes a directional coupler to separate the RF input signal from a reflected signal reflected from the antenna.

9. The impedance matching apparatus of claim 1, wherein the matching unit includes at least one capacitor and at least one inductor.

10. The impedance matching apparatus of claim 1, wherein the switching unit provides one of a CDMA signal and a GSM signal as an input signal by selectively switching the CDMA signal or the GSM signal.

11. The impedance matching apparatus of claim 1, further comprising an RF power measuring module connected to the first and second power amplifiers,
wherein the RF power measuring module detects the multiple-band RF input signal selected from RF input signals.

12. The impedance matching apparatus of claim 11, wherein the RF power measuring module includes a transceiver.

13. The impedance matching apparatus of claim 1, wherein the matching unit includes first and second variable capacitors and first to third inductors,
wherein the first variable capacitor is parallel-connected to a RF rear end, and the second variable capacitor is series-connected to the RF rear end, and
wherein the first inductor is series-connected to the RF rear end, and the second inductor is parallel-connected to the third inductor.

14. An impedance matching method of an impedance matching apparatus comprising:
amplifying multiple-band RF input signals by a power amplifying unit;

selecting one of amplified multiple-band RF input signals by a switching unit;

detecting a first RF input signal of multiple-band RF input signals by a coupler of a first power amplifier and a reflection coefficient for the RF input signals by a detector of the reflected power measuring unit;

providing the detected first RF input signal and the reflection coefficient to a controller by the first power amplifier and the reflected power measuring unit; and performing impedance matching by a matching unit so that the reflection coefficient is minimized.

15. The impedance matching method of claim 14, wherein the switching of the RF input signal includes a step of selectively switching one of a CDMA signal and a GSM signal included in the RF input signal.

16. The impedance matching method of claim 15, where the CDMA signal is amplified to a driving signal from an initial RF input signal and amplified to an output signal corresponding to an output condition.

\* \* \* \* \*